United States Patent
Peter

(10) Patent No.: US 7,271,559 B2
(45) Date of Patent: Sep. 18, 2007

(54) METHOD AND SWITCHING APPARATUS FOR RECORDING THE CURRENT IN AN ELECTRICAL DEVICE

(75) Inventor: Cornellus Peter, deceased, late of Buehl-Neusatz (DE); by Angelika Peter, legal representative, Buehl-Neusatz (DE)

(73) Assignee: Visteon Global Technologies, Inc., Van Buren Township, MI (US)

( * ) Notice: Subject to any disclaimer, the term of this patent is extended or adjusted under 35 U.S.C. 154(b) by 27 days.

(21) Appl. No.: 11/203,735

(22) Filed: Aug. 15, 2005

(65) Prior Publication Data

US 2006/0033459 A1 Feb. 16, 2006

(30) Foreign Application Priority Data

Aug. 13, 2004 (DE) .................. 10 2004 039 392

(51) Int. Cl.
 *H01R 39/46* (2006.01)

(52) U.S. Cl. ............ 318/439; 318/430; 318/432; 318/434; 318/433; 318/254

(58) Field of Classification Search ............... 318/439, 318/430, 432, 434, 254, 469, 809, 808, 470, 318/468, 139, 138; 364/424.05; 324/76.79
See application file for complete search history.

(56) References Cited

U.S. PATENT DOCUMENTS 5,204,594 A 4/1993 Carobolante ............... 318/254
6,016,042 A * 1/2000 Miura et al. ............... 318/430

FOREIGN PATENT DOCUMENTS

DE 197 04 861 A1 8/1998
WO 98/10301 3/1998

* cited by examiner

*Primary Examiner*—Karen Masih
(74) *Attorney, Agent, or Firm*—Fraser, Clemens, Martin, & Miller LLC; J. Douglas Miller

(57) ABSTRACT

A system and method for measuring the electrical current used by an electrical device and controlled according to the Pulse Width Modulation (PWM) method, such as a DC motor, the system using a Field Effect Transistor (FET) coupled to the electrical device such that the voltage applied to the FET is measured to ascertain in part, the current usage of the electrical device.

44 Claims, 2 Drawing Sheets

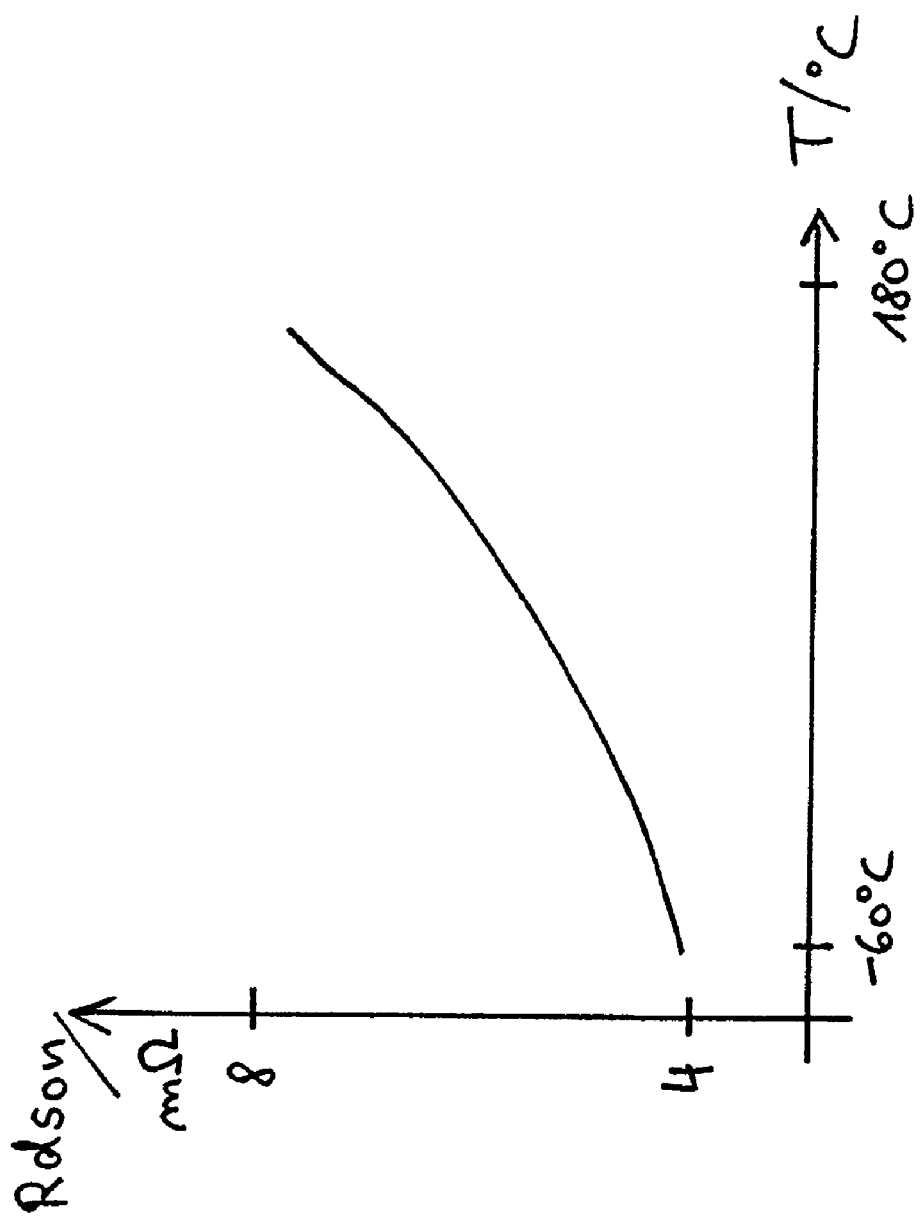

METHOD AND SWITCHING APPARATUS FOR RECORDING THE CURRENT IN AN ELECTRICAL DEVICE

This application claims priority of German Patent Application No. 10 2004 039 392.3 filed on Aug. 13, 2004.

FIELD OF THE INVENTION

The invention relates to a method and a switching apparatus for recording the current in an electrical device, which apparatus is directed according to the pulse width modulation method by means of a field effect transistor (FET) coupled with the device. The invention is especially suited for recording current in direct current motors that are directed by a high performance FET according to the pulse width modulation method.

BACKGROUND OF THE INVENTION

Direct current motors are used today in many technological fields, such as in automotive technology for powering a fan wheel of a cooling blower. The supply voltage of the direct current motor is clocked as a rule by means of an FET, which is directed according to the PWM method. Through modification of the touch proportions in use, that is, the proportions between pulse width and the length of pulse pauses, the terminal voltage on the terminals of the direct current motor can be changed, so that the current consumption of the motor and thus the torque of the drive can be modified.

To recognize disturbances and damage of the described drive system, the motor current is recorded. For instance, the color wheel can become jammed by leaves, leading to excess current and to heating and destruction of electronic components. In addition, it can result in a short-circuit, which can likewise cause damage to the drive system.

In embodiments of cooling drives commonly known in the state of the art, the current was recorded, for instance, by a shunt resistance, with the disadvantage that it can result in voltage loss.

U.S. Pat. No. 5,204,594, for instance, describes a brushless DC motor in which a shunt resistance is used in connection with an operating amplifier to record the current. Here too the result can be additional losses from the shunt resistance. In addition, the described solution is cost-intensive because an additional amplifier must be used.

It is the aim of the current invention therefore to provide an improved method and an improved switching apparatus for recording current in an electrical device, which apparatus is directed according to the pulse width modulation method by a field effect transistor that is coupled with the device, so that the method and apparatus entail fewer losses and can be produced in simple and cost-effective manner.

SUMMARY OF THE INVENTION

This aim is met by means of a method for recording current in an electric device directed according to the PWM method by an FET coupled with the device, so that the voltage positioned on the source-drain segment of the FET is measured, a temperature in the environment of the FET is measured, and the present current is ascertained from the present values for the pulse width, the source-drain segment, and the temperature.

With this method proposed in the invention, it is possible, in a simple, cost-efficient, and energy-efficient manner, for instance, to record the current in DC motors or other electrical devices, which are directed according to the pulse width modulation method by means of an FET. The invention does so by exploiting the fact that the FET behaves in directing the method as an ohmic resistance, so that the current can be determined if he voltage and the resistance are known.

The voltage is ascertained by measuring the source-drain voltage of the FET, while the resistance, which depends on the junction temperature of the FET, is ascertained through a temperature compensation. Here the method takes into account the dependence of the junction temperature on the ambient temperature and on the losses of the FET, which consist of the switching and conducting state losses, where the conducting state losses depend on the present pulse width which is adjusted at the time of pulse width modulation.

The inventive method thus does without a shunt resistance and therefore shows no additional capacity losses. In addition, costly additional components such as operating amplifiers are avoided.

According to an additional embodiment, if the supply voltage of the electrical device, which can consist or a battery voltage for instance, is subject to strong fluctuations, the present supply voltage is also measured and included in the determination of the current. The present supply voltage has an essential influence on the switching losses of the FET, which in turn have an impact on the junction temperate of the FET.

The aim of the invention is, in addition, fulfilled by means of a switching apparatus for reporting the current in an electrical device, which is directed according to the pulse width modulation method by means of an FET coupled with the device, with an initial measuring unit that is connected with the source connection of the FET and with the drain connection of the FET and is so configured that it can measure the voltage declining over the source-drain segment of the FET, with a temperature sensor configured in such a way that it can measure a temperature in the vicinity of the FET and transform it into a signal, and a control and computation unit, which is connected with the measuring unit and the temperature sensor and in addition is configured so that it can direct the FET and can ascertain the present current from the present values for the pulse width, the source-drain segment, and the temperature.

Advantageous refinements of the invention are indicated in the secondary patent claims.

The invention is elucidated below with reference to the illustration,

BRIEF DESCRIPTION OF DRAWINGS

FIG. 2 is a graph depicting the dependence of the switching device for recording current in a direct current motor. The DC motor in the foregoing example is intended to serve to power a ventilator, which serves to cool the motor in a motor vehicle.

DETAILED DESCRIPTION OF DRAWINGS

Figure 1:
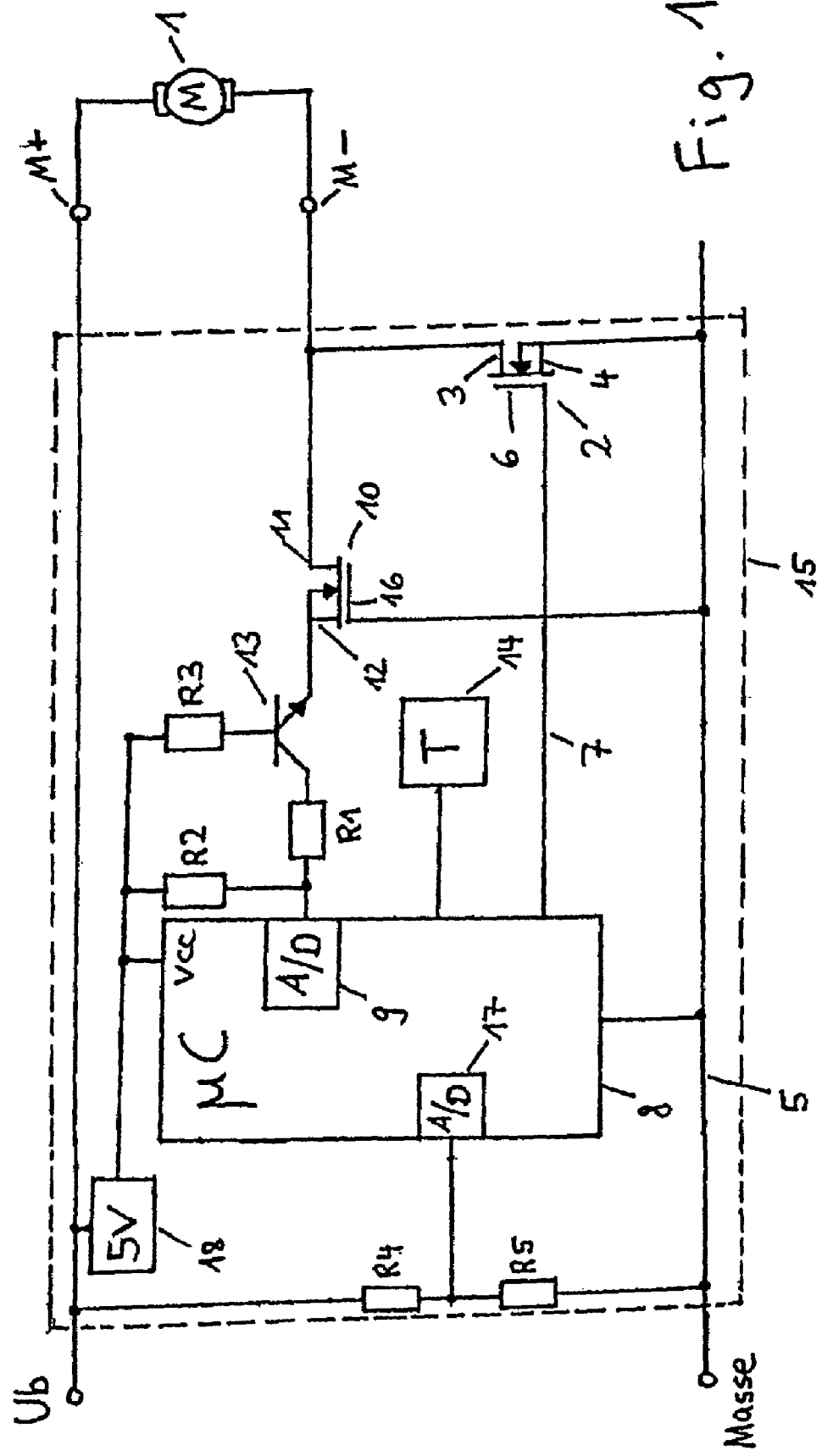
FIG. 1 is a block diagram of a first embodiment of an inventive switching device for recording the current in a direct current motor.

The DC motor 1 that powers the ventilator (not shown in FIG. 1) is connected with a motor vehicle battery (also not seen in FIG. 1), which constitutes a voltage source which delivers a supply voltage Ub. The supply voltage can thus fluctuate within a certain range and, for instance, assume values between 7 and 14 volts.

In FIG. 1, in addition, a power semiconductor component 2 is illustrated, which consists of an MOS-FET and serves to clock the supply voltage Ub. The drain connection 3 of the MOS FET 2 is thus connected with the DC motor 1. The source connection 4 of the MOS FET 2 is grounded at 5.

The gate connection 6 of the MOS FET 2 is connected by a direction line 7 with the control output of a microcontroller 8, which supplies control signals by which the MOS-FET 2 is directed according to the pulse width modulation method. If the electrical ventilator motor, for instance, can be operated only in a partial load area, then a pulse width modulation signal is selected whose pulse width is selected below 100%. The microcontroller 8 takes over the control of the pulse width depends on the need for cooling the motor, although the exact system of control is not explained here because it is not significant for the mode of functioning of the present invention. In the embodiment shown in FIG. 1, the microcontroller 8 is supplied by a voltage regulator 18 that is connected with the battery voltage Ub and supplies a constant voltage of 8 volts.

The microcontroller 8, which includes a microprocessor and a storage unit, is in addition grounded and includes a first integrated analog/digital transformer 9, at the inlet of which the voltage Udson present at the drain connection 2 of the MOS FET 2 can be applied.

To protect the inlet of the analog/digital transformer 9 from too high voltages during the switching-off phase of the MOS-FET 2, a voltage protection switch is provided, which consists of the self-conducting N-channel-MOS-FET 10. The drain connection of the N-channel-MOS-FET 0 is thus connected with the drain connection 3 of the MOS-FET 2, while its source connection 12 can be connected over the emitter-collector segment of a bipolar transistor 13 and the resistance R1 with the inlet of the analog/digital transformer 9 of the microcontroller 8. The bipolar transistor 13, whose ground base is connected by the resistance R3 with the battery voltage Ub, is normally switched through. The exact function of the bipolar transistor 3 is explained in more detail at a later point in this description.

Hereafter the function of the voltage protection switch is explained. The self-conducting B-channel-MOS-FET 10 includes a drain current/gate-source channel limit, which is similar to that of a triode; that is, the MOS-FET 10 cuts off beginning at a certain negative value of the gate-source voltage, while the is otherwise conducting. In the present case, the threshold voltage of the N-channel-MOS-FET 0 is intended to lie between 1.5 and 3 volts. The N-channel-MOS-FET 0 is a single-MOS-FET, that is, a non-integrated MOS-FET, which has a reverse diode which conducts at negative drain-source voltage.

As soon as the capacity-MOS-FET 2 is switched through during the pulse width modulation method, the voltage at the switching point M– is relatively small and lies below 1 volt. Because the drain-source voltage of the N-channel-MOS-FET 0 is negative in this case, the reverse diode of the N-channel-MOS-FET 10 switches through, and thus the source of the N-channel-MOS-FET 10 is also reduced in voltage and assumes a value that lies below 1.5 volts, that is, below the threshold voltage of the N-channel-MOS-FET 10. As a result, the N-channel-MOS-FET 10 conducts then completely and the voltage declining at M1 is also adjacent to the emitter of the bipolar transistor 13 and can be input and processed by the microcontroller through the inlet of the analog/digital transformer 9.

If the capacity MOS-FET is now blocked again during the PWM process, the voltage climbs at the switching point M–, and thus it can under some circumstances reach the avalanche voltage of the MOS-FET 2. The reverse diode of the N-channel-MOS-FET 10 in this case is blocked, so that the voltage at the source of the N-channel-MOS-FET 10 rises and exceeds the threshold voltage of the N-channel-MOS-FET, whereupon the N-channel-MOS-FET blocks and the inlet of the analog/digital transformer 9 is protected from the now high voltage at the switching point M1–. Thus the N-channel-MOS-FET performs the function of a voltage protection switch.

As already explained above, the bipolar transistor 13 is normally always switched through and thus is insignificant for the normal functioning of the switch. However, in the event that the microcontroller is switched off by the supply voltage Vcc, the bipolar transistor 13 also blocks and thus prevents otherwise flowing leaking currents, in case the switching point M1– is connected for an extended period with the supply voltage, for instance by a motor coil.

With the help of the resistances R1 and R2 the actual measurement voltage Udson can be equipped with an offset. This makes it possible to measure negative currents as well, which is significant for motor controls with current regulation circuits. In addition, the EMV behavior is decidedly improved because equal regulating effects are avoided at inlet protection diodes of the microcontroller at strong irradiation.

The microcontroller 8, by means of the voltage divider made up of the resistances R4 and R5 and a second analog-digital transformer 17 can also input a voltage which is proportionate to the battery voltage and thus can measure the exact present battery voltage Ub. It was already mentioned above that the battery voltage Ub especially in motor vehicle batteries can fluctuate over a wide range.

FIG. 1 in addition depicts a temperature sensor 14 which is applied on the conductor plate 15, on which the components and especially the capacity MOS-FET 2 are contacted. The temperature sensor 14, which is connected with the microcontroller 8, can, for instance, be an NTC-sensor. The temperature sensor 14 measures the temperature at the housing of the conductor plate, transforms the temperature value into a voltage value, and carries it on to the microcontroller 8.

Hereafter an embodiment of the inventive method for recording current in an electrical device is explained with reference to FIGS. 1 and 2.

First, in the manner described above, when the capacity MOS-FET 2 is in the switched-through mode, a present value of the drain-source-voltage Udson of the capacity MOS-FET 2 is recorded by the first analog/digital transformer 9 in the microcontroller 8.

To ascertain the current 1 that in this case flows through the capacity MOS-FET 2 and in addition constitutes a ground for the motor current of the DC motor 1, use is made at first of the following ohmic formula (1), in which Rdson is the on-resistance:

$$I = F(\text{Udson}, \text{Rdson}) = \text{Udson}/\text{Rdson} \quad (1)$$

The on-resistance Rdson of the capacity MOS-FET 2 is in turn dependent on the junction temperature Tfetjz of the capacity MOS-FET 2, as is expressed in the following equation (2):

$$\text{Rdson} = F(\text{Tfetj}) \quad (2)$$

A typical dependence between Rdson and Tfetj is shown in FIG. 2. This dependence can be entered in the form of a table in the storage device of the microcontroller 8.

To ascertain the dependence of the on-resistance on Tfetj, a temperature compensation must be carried out.

In the process, it is essential to take into account that the junction temperature Tfetj is in turn dependent on the ambient temperature Tamb, measured by the temperature sensor 14, the heat resistances between junction of the MOS-FET 2 and the conductor plate housing as well as between the conductor plate housing and the environment, which shall be expressed by the combined heat resistance Rth, as well as through the capacity losses of the capacity MOS-FET 2, which consist of the switching losses Pvsw and the conducting-state losses Pvon:

$$Tfetjz=F(Tamb,Pvsw,Pvson,Rth) \quad (3)$$

The switching losses Pvsw are dependent on the switching frequency fpwm (which is constant in the present case) of the capacity MOS-FET 2, the switching time t (switch) of the capacity MOS-FET 2, and the running of voltage and current on switching the MOS-FET 2 on and off. Here it is possible to develop a function of the switching losses that is sufficiently precise for present purposes and is dependent only on the parameters t (switch), Ub, I, and fpwm, where t (switch) and fpwm in the present case are constants:

$$Pvsw=F(Ub,I,t(switch),fpwm) \quad (4)$$

Finally, the circuit switching losses Pvon depend on the on-resistance Rdson, the desired current (, and the pulse width PWM presently in use in the pulse width modulation process, which is expressed in the following equation 5:

$$Pvon=F(Rdson,I,PWM) \quad (5)$$

The greater the pulse width, the greater are the circuit switching losses.

With the help of equations (1), (2), (3), (4), and (5), the present current can now be ascertained from the microcontroller 8, in which these equations are stored. The microcontroller first measures the present value for the battery voltage Ub. Then the recorded present value for the drain-source voltage Udson of MOS-FET 2 and the value for the present ambient temperature Tamb are entered by the temperature sensor 14. Finally the present pulse width PWM is naturally known to the microcontroller, because this value is adjusted by the microcontroller, which also takes on the direction of the capacity MOS-FET. With the help of these current values for Udson, Ub, Tamb, and PWM, the present current I is ascertained from observation of the constants Rth, t (switch), fpwm through a recursive process.

From the foregoing equations (5), an equation system with two equations can be constructed, which express reciprocal dependences between Tfetj and I. Now, according to the recursive process, a starting value for the combination Tfetj and I is tried and the values of Tfetj and I are successively modified, until the aforementioned equations (1) to 94) apply with sufficient exactitude. The value so obtained is then the present desired current I.

In another embodiment of the process, which does not use a variable battery voltage but rather a constant supply voltage, Ub can be accepted as a constant.

The inventive process can then be expanded in such a way as to establish whether the conveyed current exceeds and/or falls short of a predetermined current threshold. Thus, for instance, the microcontroller can compare the obtained present current value 1 with a predetermined critical current value that is also stored in the storage unit of the microcontroller 8, and which may not be exceeded and, for instance, can refer to a short-circuit.

If the critical current value is exceeded, a signal can be produced by the microcontroller, whereupon the capacity FET 2 is blocked.

Besides the short-circuit monitoring, the inventive method can also be used, for instance, for detecting jamming, to determine whether the ventilator, for instance, has become jammed from the impact of leaves.

According to other embodiments of the invention, the ascertained current value can also be used for current regulation.

Of course, the temperature sensor 14 used in conjunction with the invention does not necessarily have to be mounted on the conductor plate on which the capacity FET 2 is contacted. It only needs to be mounted in the closer or more distant proximity of the capacity FET, so that conclusions can be drawn about the junction-temperature behavior of the FET over known thermal resistances.

The inventive method as well as the inventive switching apparatus can of course be used not just in DC motors but also in any other electrical devices that are directed by an FET.

What is claimed is:

1. A method for recording current in an electric device driven by an FET coupled with the device according to a pulse width modulation method, comprising the steps of:
   a present value of voltage situated on a source-drain segment of the FET is measured;
   a present value of temperature in an environment of the FET is measured; and
   a present current is ascertained from the present values for a pulse width, the source-drain voltage, and the temperature.

2. The method according to claim 1, wherein in addition a present value of a supply voltage clocked by the pulse width modulation is measured and is taken into account in ascertaining the current.

3. The method according to claim 2 wherein the supply voltage consists of a battery voltage.

4. The method according to claim 1 wherein, in addition, before the current is ascertained, a dependence of an on-resistance of the FET is ascertained from a junction temperature of the FET.

5. The method according to claim 1 wherein connections between the current to be ascertained and a junction temperature of the FET are used to ascertain the current.

6. The method according to claim 5 wherein the connections consist of a dependence of the current on the source-drain voltage and an on-resistance of the FET, a dependence of the on-resistance on the junction temperature of the FET, a dependence of the junction temperature of the FET on the ambient temperature, conducting state losses of the FET, switching losses of the FET, a dependence of the conducting state losses on the on-resistance of the FET, the current, the pulse width, and a dependence of the switching losses on a supply voltage and the current.

7. The method according to claim 6 wherein in addition a constant switching frequency of the FET is included in a computation of the switching losses.

8. The method according to claim 6 wherein in addition a predetermined switching time of the FET is included in a computation of the switching losses.

9. The method according to claim 6 wherein in addition a predetermined heat resistance is included in a computation of the conducting state losses for a transition from FET junction to the environment.

10. The method according to claim 5 wherein the current is ascertained with the help of a recursive process.

11. The method according to claim 10 wherein the recursive process is conducted in such a way that starting values for the current to be ascertained and the junction temperature of the FET are determined and then modified until the values adapt to the connections with sufficient precision.

12. The method according to claim 1 which in addition includes a step of establishing whether the ascertained current exceeds or falls below a predetermined current threshold.

13. The method according to claim 12 wherein in addition the FET is blocked if the ascertained current exceeds or falls short of the predetermined current threshold.

14. The method according to claim 1 wherein the FET is a capacity FET.

15. The method according to claim 1 wherein the FET is a MOS-FET.

16. The method according to claim 1 wherein the electrical device is a DC motor.

17. The method according to claim 16 wherein the DC motor is brushless.

18. The method according to claim 13 which can be used for jamming protection.

19. The method according to claim 13 which is used for short-circuit monitoring.

20. The method according to claim 1 wherein the ascertained current is used for current regulation.

21. The method according to claim 1 wherein the measurement of the temperature in the vicinity of the FET is performed in such a way that a temperature sensor is mounted on the conductor plate on which the FET is in contact.

22. The method according to claim 21 wherein the temperature sensor consists of an NTC sensor.

23. A switching apparatus for recording current in an electric device, which is directed by an FET coupled with the device according to a pulse width modulation method, comprising:
   an initial measurement unit that is connected with a source connection of the FET and with a drain connection of the FET and is configured in such a way that it can measure voltage declining over a source-drain segment of the FET;
   a temperature sensor that is configured in such a way that can measure a temperature in a vicinity of the FET and can transform it into a signal; and
   a control and computation unit, which is connected with the measurement unit and the temperature sensor and in addition is configured in such a way tat it can direct the FET and can ascertain the present current from present values for the pulse width, the source-drain voltage, and the temperature.

24. The switching apparatus according to claim 23 which in addition includes a second measurement unit configured in such a way that it can measure a supply voltage mounted on the electric device, where the control and computation unit is connected with the second measurement unit and takes into account the present supply voltage in ascertaining the present current.

25. The switching apparatus according to claim 24 wherein the control and computation unit in addition includes a storage unit in which a previously ascertained table is filed, containing data that represent a dependence of an on-resistance of the FET on the junction temperature of the FET.

26. The switching apparatus according to claim 25 wherein the control and computation unit in addition is configured in such a way tat it uses the connections between the current to be ascertained and the junction temperature of the FET in order to ascertain the present current.

27. The switching apparatus according to claim 26 wherein the connections consist of:
   the dependence of the current on the source-drain voltage and the on-resistance of the FET;
   the dependence of the on-resistance on the junction temperature of the FET;
   the dependence of the junction temperature of the FET on the ambient temperature, the conducting state losses of the FET, the switching losses of the FET;
   the dependence of the conducting state losses on the on-resistance of the FET, the current, and the pulse width; and
   the dependence of the switching losses on the supply voltage and the current.

28. The switching apparatus according to claim 27 wherein the control and computation unit in addition is configured in such a way tat it can include a constant switching frequency of the FET in computing the switching losses.

29. The switching apparatus according to claim 28 wherein the control and computation unit in addition is configured in such a way that it can include a predetermined switching time of the FET in computing the switching losses.

30. The switching apparatus according to claim 29 wherein the control and computation unit in addition is configured in such a way that it can include a predetermined heat resistance for the transition FET junction to environment in computing the conducting state losses.

31. The switching apparatus according to claim 30 wherein the control and computation unit in addition is configured in such a way that it can ascertain the current with the help of a recursive process.

32. The switching apparatus according to claim 31 wherein the control and computation unit in addition is configured in such a way that it can carry out the recursive method in such a way that starting values for the current to be ascertained and the junction temperature of the FET can be determined and then modified until the values adapt to the connections with sufficient precision.

33. The switching apparatus according to claim 32 wherein the FET is a capacity FET.

34. The switching apparatus according to claim 33 wherein the FET is a MOS-FET.

35. The switching apparatus according to claim 34 wherein the electric device is a DC motor.

36. The switching apparatus according to claim 35 wherein the DC motor is brushless.

37. The switching apparatus according to claim 36 wherein the temperature sensor is mounted on a conductor plate on which the FET is in contact.

38. The switching apparatus according to claim 37 wherein the temperature sensor is an NTC sensor.

39. The switching apparatus according to claim 38 wherein the first measurement unit, the second measurement unit, and the control and computation unit are integrated into a microcontroller which includes a processor and a storage device.

40. The switching apparatus according to claim 39 wherein the microcontroller includes an analog-digital transformer, at the inlet of which the voltage to be measured, which declines on the source-drain segment of the FET, is mounted.

41. The switching apparatus according to claim 40 wherein a voltage protection switch is provided, which protects an inlet of the analog-digital transformer from critical voltages.

42. The switching apparatus according to claim 41 wherein the voltage protection switch consists of a self-conducting N-channel-individual-MOS-FET with reverse diode.

43. The switching apparatus according to claim 42 wherein the source connection of the N-channel-MOS-FET is coupled with the inlet of the analog-digital transponder, while its drain connection is coupled with the drain connection of the FET and its gate connection is coupled with the ground.

44. The direct current motor with an on-switch tat includes a switching device according to claim 43.

* * * * *